(12) United States Patent
Van Kampen et al.

(10) Patent No.: US 10,224,164 B2
(45) Date of Patent: Mar. 5, 2019

(54) MERGED LEGS AND SEMI-FLEXIBLE ANCHORING HAVING CANTILEVERS FOR MEMS DEVICE

(75) Inventors: Robertus Petrus Van Kampen, S-Hertogenbosch (NL); Anartz Unamuno, Dresden (DE); Richard L. Knipe, McKinney, TX (US); Roberto Gaddi, S-Hertogenbosch (NL); Rashed Mahameed, Beaverton, OR (US)

(73) Assignee: CAVENDISH KINETICS, INC., San Jose, CA (US)

(*) Notice: Subject to any disclaimer, the term of this patent is extended or adjusted under 35 U.S.C. 154(b) by 1065 days.

(21) Appl. No.: 14/240,670

(22) PCT Filed: Sep. 4, 2012

(86) PCT No.: PCT/US2012/053699
§ 371 (c)(1),
(2), (4) Date: May 9, 2014

(87) PCT Pub. No.: WO2013/033722
PCT Pub. Date: Mar. 7, 2013

(65) Prior Publication Data
US 2014/0238828 A1 Aug. 28, 2014

Related U.S. Application Data

(60) Provisional application No. 61/530,533, filed on Sep. 2, 2011.

(51) Int. Cl.
*H01H 59/00* (2006.01)
*B81B 7/04* (2006.01)
*B81B 3/00* (2006.01)

(52) U.S. Cl.
CPC ....... *H01H 59/0009* (2013.01); *B81B 3/0097* (2013.01); *B81B 7/04* (2013.01);
(Continued)

(58) Field of Classification Search
CPC ........ B81B 2201/014; B81B 2201/018; B81B 2203/0118; B81B 2203/00;
(Continued)

(56) References Cited

U.S. PATENT DOCUMENTS

| 4,893,048 A * | 1/1990 | Farrall ................. H01H 1/2066 200/181 |
| 5,235,225 A * | 8/1993 | Colgate ................. B82Y 15/00 310/12.18 |

(Continued)

FOREIGN PATENT DOCUMENTS

CN 1716492 A 1/2006

OTHER PUBLICATIONS

International Search Report and Written Opinion issued in PCT/US2012/053699, dated Nov. 16, 2012.
(Continued)

*Primary Examiner* — Bernard Rojas
*Assistant Examiner* — Maged M Almawri
(74) *Attorney, Agent, or Firm* — Patterson & Sheridan, LLP; Steven Versteeg

(57) ABSTRACT

The present invention generally relates to a MEMS device having a plurality of cantilevers that are coupled together in an anchor region and/or by legs that are coupled in a center area of the cantilever. The legs ensure that each cantilever can move/release from above the RF electrode at the same voltage. The anchor region coupling matches the mechanical stiffness in all sections of the cantilever so that all of the cantilevers move together.

9 Claims, 12 Drawing Sheets

(52) U.S. Cl.
CPC . *B81B 2201/018* (2013.01); *B81B 2203/0109* (2013.01); *B81B 2203/0118* (2013.01); *B81B 2203/0172* (2013.01); *B81B 2203/0307* (2013.01)

(58) Field of Classification Search
CPC ........ B81B 2203/01; B81B 2203/0307; B81B 2203/0109; B81B 2203/0172; B81B 3/0097; B81B 7/00; B81B 7/0003; B81B 7/0022; B81B 7/0016; B81B 7/0045; B81B 7/0058; B81B 7/0074; B81B 7/04; H02H 59/0009; H02H 2237/004; H01H 59/0009
USPC ...... 310/40 MM, 309, 303, 306, 12.03, 308; 335/78; 200/181; 333/101, 105, 262, 333/336, 108
See application file for complete search history.

(56) References Cited

U.S. PATENT DOCUMENTS

| | | | | |
|---|---|---|---|---|
| 5,304,970 A * | 4/1994 | Okamoto | ........... | H01H 49/00 335/78 |
| 5,757,255 A * | 5/1998 | Noda | ........... | H01H 50/642 335/129 |
| 5,856,722 A * | 1/1999 | Haronian | ........... | G01H 3/08 310/309 |
| 5,909,162 A * | 6/1999 | Ikeda | ........... | H01H 51/229 335/125 |
| 6,000,280 A | 12/1999 | Miller et al. | | |
| 6,107,903 A * | 8/2000 | Sako | ........... | H01H 51/229 335/202 |
| 6,115,231 A * | 9/2000 | Shirakawa | ........ | H01H 59/0009 200/181 |
| 6,153,839 A * | 11/2000 | Zavracky | ........... | H01H 59/0009 200/181 |
| 6,608,542 B2 * | 8/2003 | Pietsch | ........... | H01H 50/28 335/274 |
| 6,686,820 B1 * | 2/2004 | Ma | ........... | H01H 59/0009 333/258 |
| 6,740,946 B2 * | 5/2004 | Funaki | ........... | B81B 3/0021 200/181 |
| 6,788,175 B1 | 9/2004 | Prophet | | |
| 6,806,545 B2 * | 10/2004 | Shim | ........... | H01H 59/0009 257/415 |
| 6,815,866 B2 * | 11/2004 | Lee | ........... | B81B 3/0078 310/26 |
| 7,053,736 B2 * | 5/2006 | Nelson | ........... | B81B 3/0054 200/181 |
| 7,242,273 B2 * | 7/2007 | Isobe | ........... | H01H 59/0009 200/181 |
| 7,321,275 B2 * | 1/2008 | Chou | ........... | H01H 59/0009 333/105 |
| 7,355,258 B2 * | 4/2008 | Valenzuela | ........... | G11C 11/50 200/181 |
| 7,368,846 B2 * | 5/2008 | Mushika | ........... | G02B 26/0841 310/309 |
| 7,709,757 B2 * | 5/2010 | Charvet | ........... | B81B 3/0086 200/181 |
| 7,728,703 B2 | 6/2010 | Kim et al. | | |
| 7,745,747 B2 * | 6/2010 | Carmona | ........... | H01H 59/0009 200/181 |
| 7,782,170 B2 * | 8/2010 | Robert | ........... | H01H 59/0009 200/181 |
| 8,294,539 B2 * | 10/2012 | Ellis | ........... | H01H 59/0009 200/181 |
| 8,729,770 B1 * | 5/2014 | Milanovic | ........... | G02B 26/0841 310/308 |
| 8,772,999 B2 * | 7/2014 | Mohanty | ........... | H03H 9/02244 310/309 |
| 9,583,294 B2 * | 2/2017 | Lee | ........... | H01H 1/0036 |
| 9,748,048 B2 * | 8/2017 | Fitzgerald | ........... | H01H 1/0036 |
| 2003/0042117 A1 * | 3/2003 | Ma | ........... | B81B 3/007 200/181 |
| 2003/0132822 A1 * | 7/2003 | Ko | ........... | B81B 3/0021 335/78 |
| 2003/0183887 A1 * | 10/2003 | Lee | ........... | B81B 3/0078 257/414 |
| 2004/0008097 A1 * | 1/2004 | Ma | ........... | H01H 59/0009 333/262 |
| 2004/0050675 A1 * | 3/2004 | Feng | ........... | H01H 59/0009 200/181 |
| 2004/0061579 A1 * | 4/2004 | Nelson | ........... | B81B 3/0054 335/78 |
| 2004/0113727 A1 * | 6/2004 | Kawai | ........... | H01H 59/0009 335/78 |
| 2005/0012562 A1 * | 1/2005 | Shin | ........... | H01H 59/0009 333/105 |
| 2006/0145793 A1 * | 7/2006 | Ning | ........... | H01H 59/0009 335/78 |
| 2006/0181377 A1 * | 8/2006 | Kweon | ........... | H01H 59/0009 335/78 |
| 2006/0290443 A1 * | 12/2006 | Chou | ........... | H01H 59/0009 333/105 |
| 2008/0047809 A1 * | 2/2008 | Lisec | ........... | H01P 1/127 200/181 |
| 2008/0190748 A1 * | 8/2008 | Arthur | ........... | H01H 59/0009 200/181 |
| 2008/0265710 A1 * | 10/2008 | Ikehashi | ........... | H02N 1/006 310/309 |
| 2009/0127082 A1 * | 5/2009 | Zhang | ........... | H01H 1/0036 200/181 |
| 2009/0256297 A1 * | 10/2009 | Geisberger | ........... | G01P 15/125 267/160 |
| 2010/0116632 A1 * | 5/2010 | Smith | ........... | B81B 7/04 200/181 |
| 2010/0155202 A1 * | 6/2010 | Ellis | ........... | H01H 59/0009 200/181 |
| 2010/0187076 A1 * | 7/2010 | Goggin | ........... | B81B 7/0012 200/283 |
| 2010/0295639 A1 * | 11/2010 | Kawabata | ........... | B81B 3/0037 335/106 |
| 2011/0100793 A1 * | 5/2011 | Ziaei | ........... | H01H 59/0009 200/600 |
| 2011/0140570 A1 | 6/2011 | Masunaga et al. | | |
| 2012/0068278 A1 * | 3/2012 | Knipe | ........... | H01H 1/0036 257/418 |
| 2015/0355457 A1 * | 12/2015 | Matsumoto | ........... | G02B 26/02 345/156 |
| 2016/0023244 A1 * | 1/2016 | Zhuang | ........... | B06B 1/0292 310/300 |
| 2016/0134256 A1 * | 5/2016 | Kare | ........... | H03H 9/145 333/193 |

OTHER PUBLICATIONS

Chinese Office Action (with attached English translation) for Application No. 201280042848.X dated Jan. 25, 2016; 16 total pages.
Office action for Japanese Patent Application No. 2014-528697 dated Jun. 29, 2016.
European Office Action dated Nov. 25, 2016 for European Patent Application No. 12827352.1.
Examination Report issued in corresponding European Patent Application No. 12827352.1, dated Aug. 13, 2018 (4 pages).

* cited by examiner

MERGED LEGS AND SEMI-FLEXIBLE ANCHORING HAVING CANTILEVERS FOR MEMS DEVICE

BACKGROUND OF THE INVENTION

Field of the Invention

Embodiments of the present invention generally relate to a MEMS device and designs for both anchoring the MEMS device and ensuring switching elements switch together.

Description of the Related Art

When making an array of MEMS devices that need to switch together, variations in the processing of the devices result in different threshold voltages for different switches. The processing variations can alter the lateral dimensions due to fluctuations in the lithography of the etch process. Variations in deposition can result in different thicknesses of material and variation in the deposition of the landing regions can result in different roughness values under different switches which results in different amounts of adhesion or stiction. When making a digital variable capacitor, one may want to switch a large area device in order to get a large capacitance change. It is hard to etch out under large areas and it is hard to support large area devices without making them very thick, so it is advantageous to make a large number of small capacitor MEMS switches and switch them together. The problem with this is that the variation discussed earlier results in different switching voltages for the different devices.

Additionally, a MEMS variable capacitor can be built using two plates (i.e., electrodes) of which at least one of them is movable (also called a membrane). As the two electrodes get closer together the capacitance increases. The movable electrode is anchored with a compliant mechanical support. Electrostatic forces can be used to overcome the mechanical stiffness of the support and move the membrane to change the capacitance.

The stiffness of the mechanical support is very sensitive to the mechanical stress, and therefore, the operating electrical conditions for conventional mechanical supports can suffer large variations, widening voltage distributions and reducing reliability. This can be partially corrected by controlling the stresses during fabrication. However, keeping stress under control is not always an easy task.

Therefore, there is a need in the art for a MEMS device addresses the above mentioned stress issues and ensures an array of switches switch together.

SUMMARY OF THE INVENTION

The present invention generally relates to a MEMS device having a plurality of cantilevers that are coupled together in an anchor region and/or by legs that are coupled in a center area of the cantilever. The legs ensure that each cantilever can move/release from above the RF electrode at the same voltage. The anchor region coupling matches the mechanical stiffness in all sections of the cantilever so that all of the cantilevers move together.

In one embodiment, a MEMS device comprises a first cantilever; a second cantilever; and one or more legs coupled to both the first cantilever and the second cantilever, the one or more legs also coupled to an anchor area that is spaced from both the first cantilever and the second cantilever.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

The present invention generally relates to a MEMS device having a plurality of cantilevers that are coupled together in an anchor region and/or by legs that are coupled in a center area of the cantilever. The legs ensure that each cantilever can move/release from above the RF electrode at the same voltage. The anchor region coupling matches the mechanical stiffness in all sections of the cantilever so that all of the cantilevers move together.

To solve the problem of an array of switching elements not switching together, rows of small MEMS cantilever capacitance switches can be mechanically tied together so that when one moves there is a force on its neighbor causing it to move as well. A whole line of such devices can be linked in this manner.

The arrays of cantilevers can be housed in the same cavity. By connecting the cantilevers together the probability that one of the arrays fails to switch due to problems with adhesion is reduced. It also ensures that all members of the array switch at similar voltages reducing variations caused by differences in adhesion or variations in the processing or each switch.

There are several advantages to ensuring the array of switches all switch together. One advantage is that there is a reduced variation in switching voltage for the array. Another advantage is that there is more uniform switching from array to array. Additionally, faster sacrificial etch under the array compared to one large area MEMS device of the same area as the array may be accomplished. If the devices are not linked together, some devices would need larger voltages to switch than their neighbors; as these devices share the same metal pad above or below for providing electrostatic voltages, devices that have early switching will be subject to overvoltage. Overvoltage could lead to reduced lifetime for that particular early switching device. Thus, the device linkage will increase device lifetime.

Figure 1A:
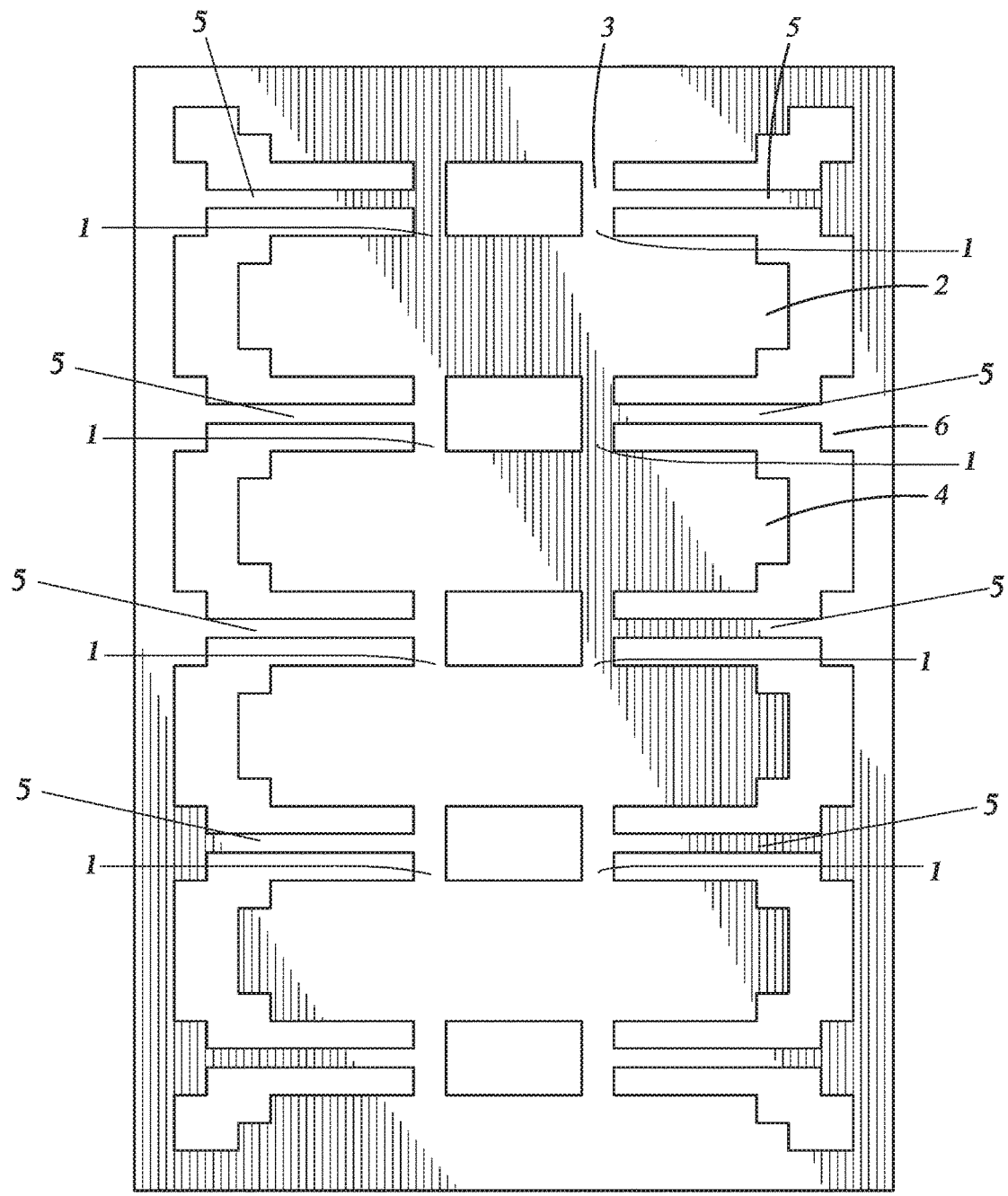
FIGS. 1A and 1B shows four MEMS cantilever devices.
Figure 1B:
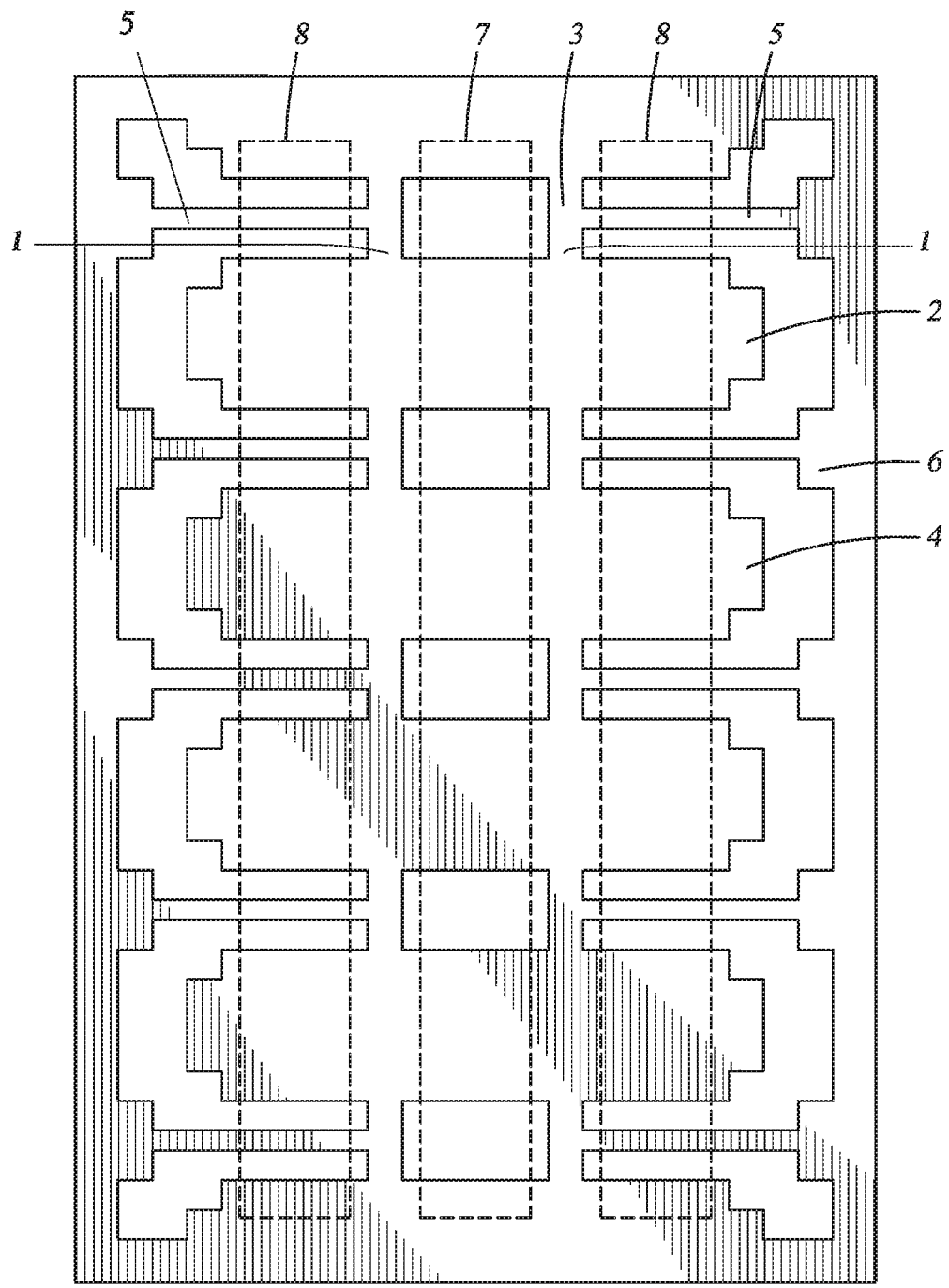

FIGS. 1A and 1B show four MEMS cantilever devices. Region 1 marks two legs holding up the top right and left hand side of the top cantilever. The MEMS cantilever 2 has a pull down electrode underneath and can have a pull up electrode above. Region 3 marks the merged leg region where cantilever 2 and cantilever 4 are joined. The cantilevers 2, 4 both share leg 5 on the right hand side. This is mirrored on the other side with the other leg. The legs are anchored at the regions marked 6.

Figure 2:
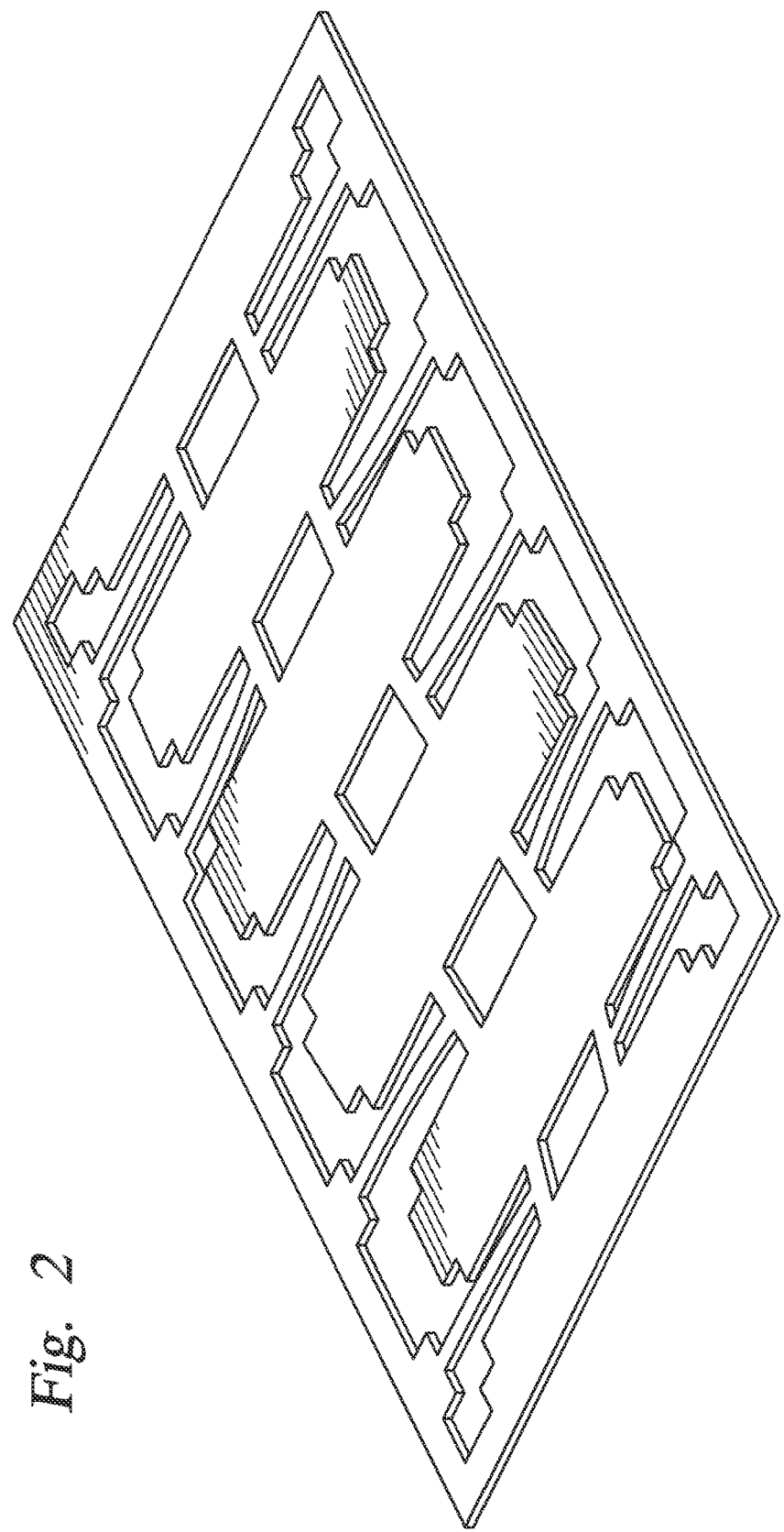
FIG. 2 shows how four cantilevers will be able to move and assist on one another utilizing the merged legs.

In FIG. 1B, the dot dashed lines mark the edge of pads under the array of MEMS devices. In this example electrode 7 is an RF electrode which may be coated with an insulator for an RF variable capacitor. When the MEMS devices are grounded the capacitance between the RF electrode and the grounded MEMS devices can be changed by putting voltages on the electrodes 8. The electrodes 8 pull the array of cantilevers 2, 4 so that the cantilevers 2, 4 are closer to the RF electrode 7 and thus the capacitance to ground from the RF electrode 7 increases. A pull up electrode over the array is used to pull the cantilever 2, 4 to a cavity roof (not shown). This provides a capacitance minimum for the RF electrode 7. FIG. 2 shows how four cantilevers will be able to move and assist on one another utilizing the merged legs.

In regards to the semi-flexible anchoring scheme, the semi-flexible anchoring scheme presented here uses mechanical decoupling loops arranged in a specific manner that makes the operating voltage less sensitive to mechanical stresses (residual, temperature, etc.) and at the same time provides a way of reducing the operating voltage. Two added design features presented here add the possibility to obtain a uniform deflection along the membrane and therefore achieve an equally distributed impact force of the moving membrane, enhancing the reliability of the MEMS device. These features are mechanical links that can be placed at different locations along the membrane, and end-section stubs to match the mechanical stiffness in all sections of the membrane.

By using the semi-flexible anchoring scheme presented here, it is possible to: achieve lower operating voltages, by reducing the stiffness of the mechanical fixture; and reduce the effect of stress (residual, temperature induced, etc.), obtaining tighter pull-in and release distributions and therefore a more uniform operation, requiring less over-voltage to reach the maximum capacitance, and therefore improving the reliability of the device.

The additions of the end-stub and linkage along the membrane provide: matching the mechanical stiffness along the membrane body, making it move in sync as a uniform entity for end-stubs; and links make the switch move as a single uniform entity for linkage along the membrane. Additionally, the uniform displacement improves the reliability of the device by reducing the localized damage points at impact locations, and RF efficiency is improved due to redistribution of currents.

Discussed herein are four types of semi-flexible anchoring schemes are shown below, which have different configurations and provide different stiffness. It is possible to change this stiffness by adjusting the length and width of the different sections of the semi-flexible anchors. Longer and narrower links make the membrane less stiff, and therefore reduce the operating voltage.

The flexible-anchor also works as a stress release mechanism. When tensile or compressive stresses affect the mechanical structure, this semi-flexible anchor provides the stress release loops without affecting the shape of the membrane's body, and therefore enabling uniform operation of the membrane.

All four implementations shown in FIG. 4, FIG. 6, FIG. 8 and FIG. 10 describe a top view of a possible MEMS variable capacitor, comprising two "pull-in electrodes" (also called control electrodes), one "RF" electrode running parallel to the "pull-in electrodes", and a membrane which includes the "semi-flexible anchor" and the "Anchor" that mechanically attaches the membrane to the lower metal layers.

End-Stubs

Figure 3A:
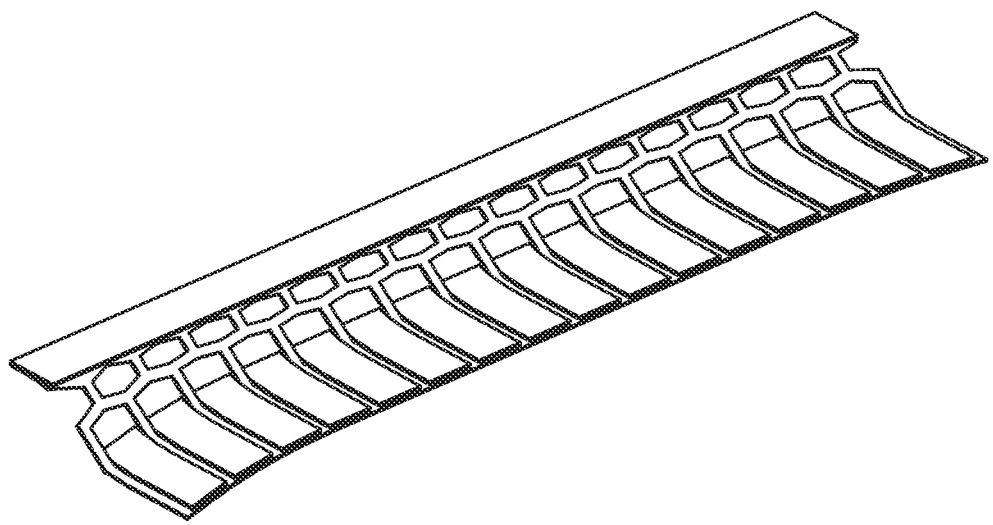
FIG. 3A is a simulated deflection for a design without stubs.
Figure 3B:
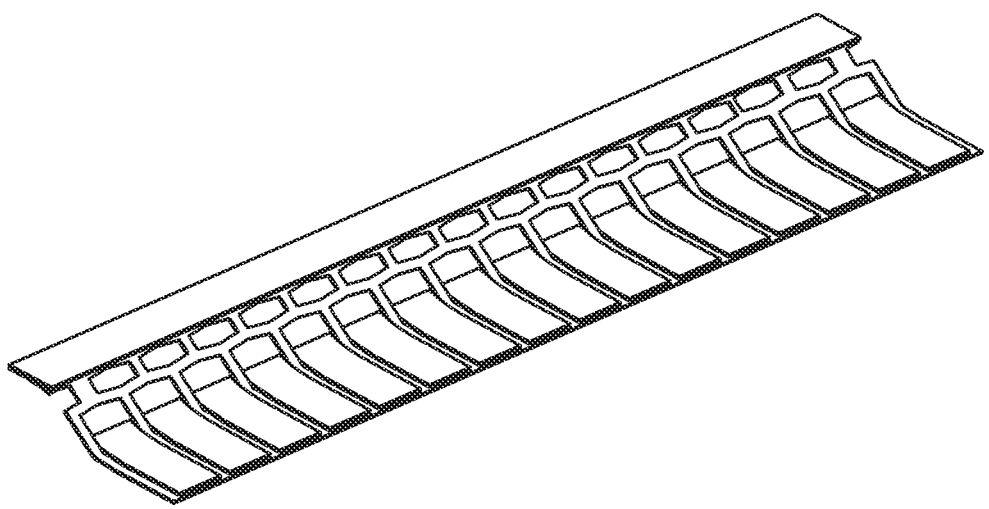
FIG. 3B is a simulated deflection design with the stubs.

FIGS. 3A and 3B show the simulation results of a membrane's deflection when a constant and uniform pressure is applied (FIGS. 3A and 3B only show half model, simulated using a symmetry-boundary condition along the centre of the membrane). In FIG. 3A there are no stiffening stubs, and the ends-sections of the membrane deflect more than the center sections. In FIG. 3B, stubs were added and their dimensions were optimized by simulations to obtain the flat deflection. Different semi-flexible anchor schemes can be used with different placement and dimensioning of the stubs. The options are shown within the description of each implementation below.

Implementation 1—Parallel Slots on Anchor

Figure 4:
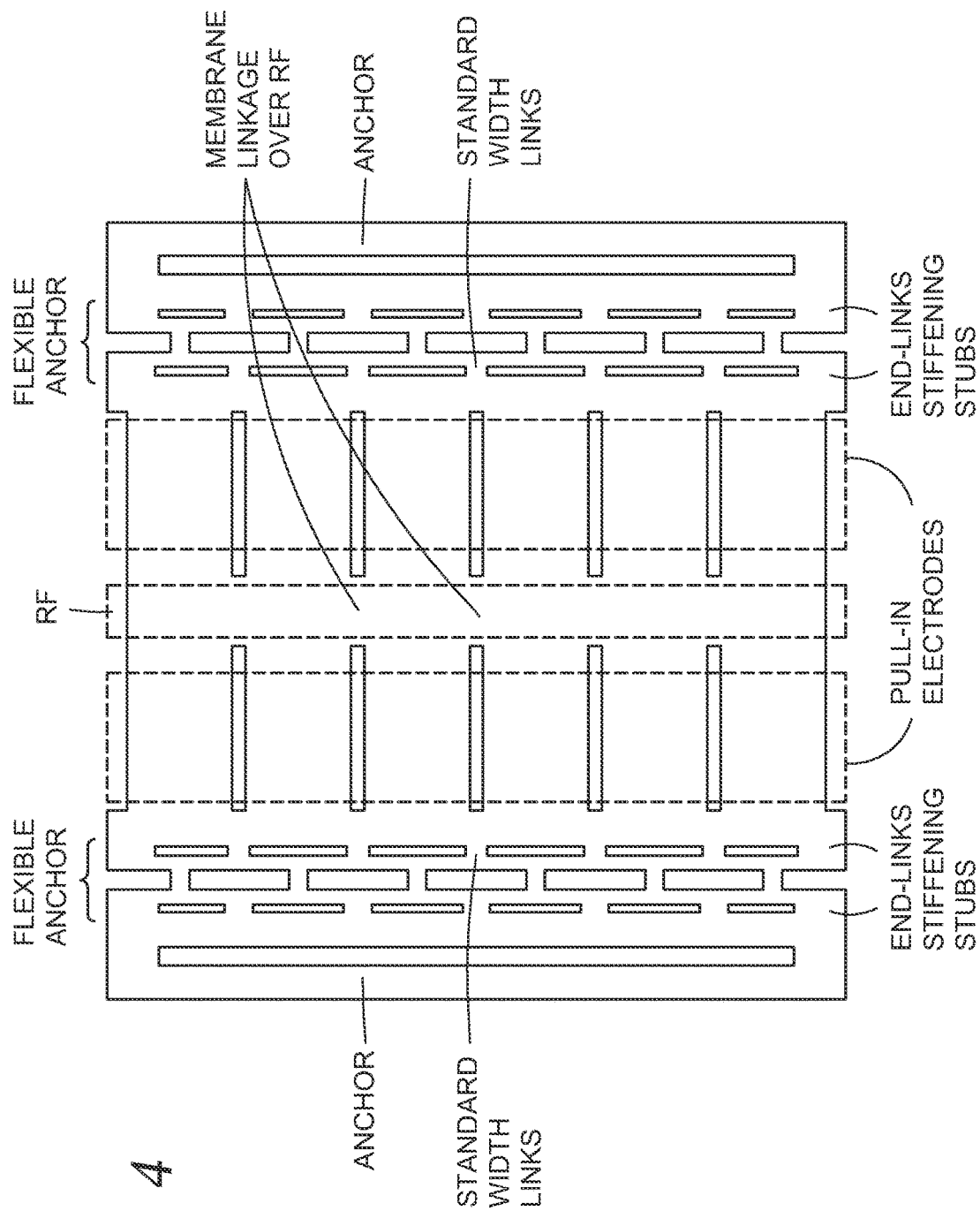
FIG. 4 shows implementation 1 of the semi-flexible anchor with parallel slots.

Slots in parallel to the anchor are used in the implementation shown in FIG. 4 to generate a semi-flexible anchor. The stiffness is reduced (compared to a full-width anchor) by the use of the slots, and it can be adjusted changing the number and dimensions of slots/beams/links. FIG. 4 also shows an implementation of the membrane linkage, which in this case it is located on top of the RF electrode. The wider the connecting link, the more uniform the device should operate, assuming there is no stress issues.

This configuration has the advantage of pulling the full RF section as a single structure, which could help achieving better distributions on maximum capacitances. It might also provide a better hot-switch (RF voltage at which the membrane releases from the maximum capacitance state when the control voltage is removed), as all sections can help each other.

Figure 5:
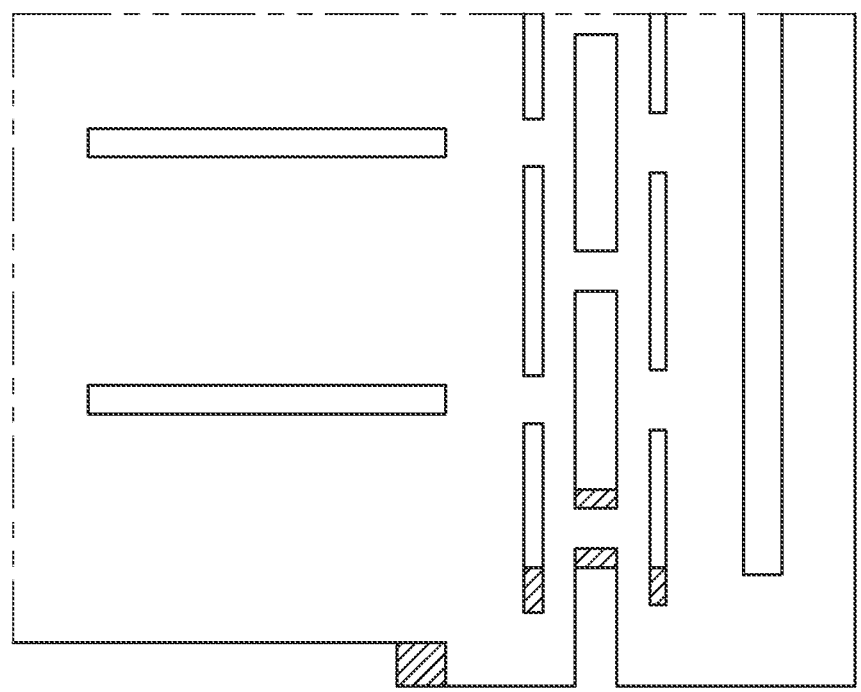
FIG. 5 shows possible locations of stiffening end-stubs for implementation 1 marked with dark patches.

With respect to the stiffening stubs on the end sections of the membranes, FIG. 4 shows the optimized stubs for this particular design within dashed circles. In FIG. 5, other possible locations for the stub are shown. Any combination could also be used. The main goal of the stiffening stubs on the end-sections is to increase the stiffness of the beams of this end-section. This is required since this end-section does not have a neighboring section forcing a symmetry boundary condition down the center-line of the link. The symmetry boundary condition on the standard links result in a greater stiffness of the flexible anchor. By increasing the stiffness of the last section, its flexible-anchor stiffness is matched to the stiffness of the flexible-anchors of the internal sections.

Implementation 2—Extended Parallel Slots on Anchor

Figure 6:
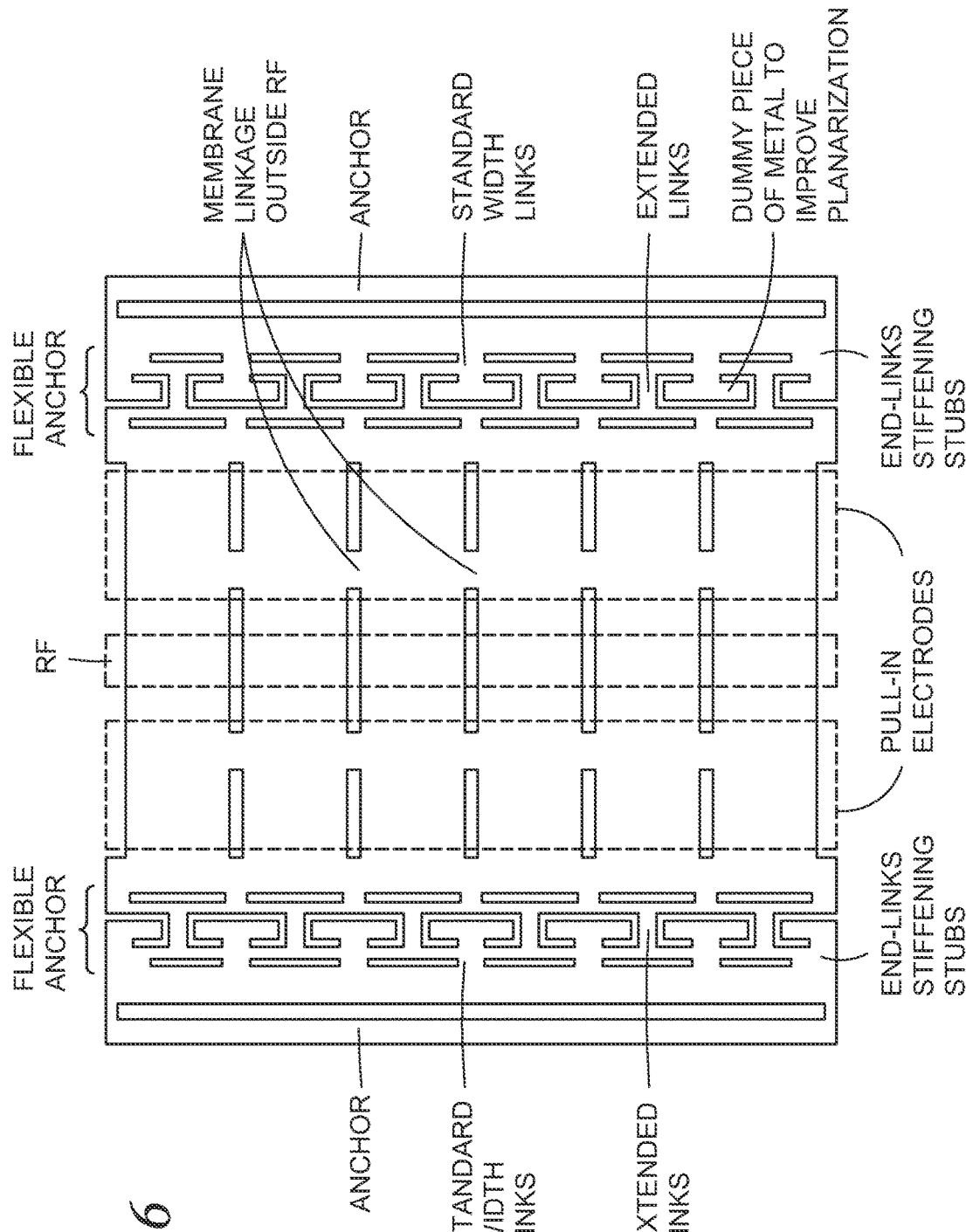
FIG. 6 shows implementation 2 of the semi-flexible anchor with extended parallel slots, including a dummy fill to increase planarity of subsequent levels.
Figure 7:
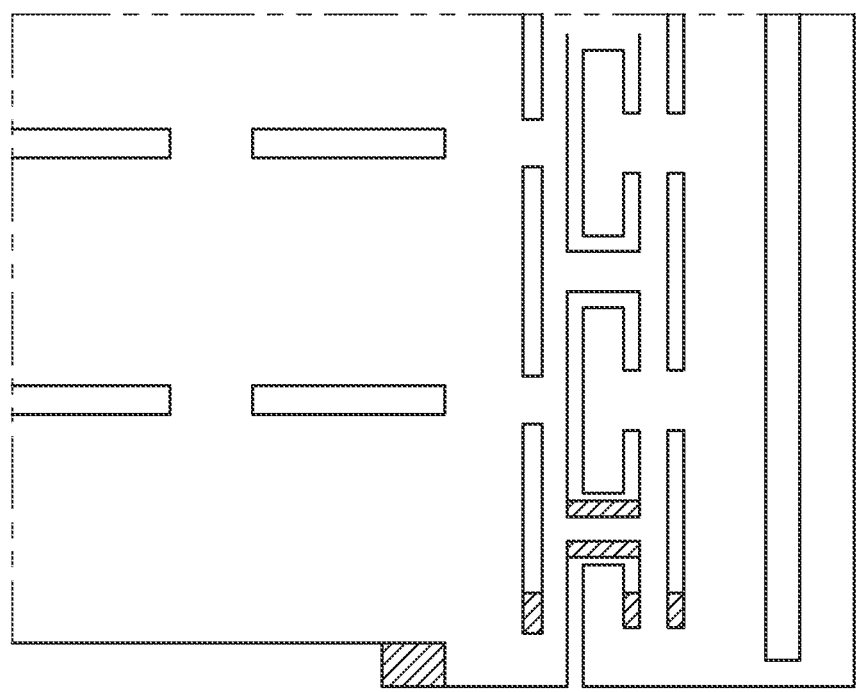
FIG. 7 shows other possible configurations for the end-section stubs for implementation 2.

This is similar to the implementation shown in FIG. 4, but with a longer linking bar (shown inside a double circle) to obtain a lower stiffness and therefore operating voltage. The gaps created by extending the link were filled with dummy pieces to improve planarity of subsequent sacrificial depositions. In this case, the membrane linkages happen in a location other than on top of the RF. In this case the hot-switch voltage is further improved as the neighboring sections still help each other mechanically and the electrostatic force pulling on each section down due to a voltage on the RF-electrode is reduced because the the area in contact with the RF electrode is reduced. The location and dimensions of the membrane links can vary to obtain best mechanical performance taking into account possible stress issues in the long direction of the membrane. The stiffening stubs on the mechanical links at the end of the membrane are also shown in FIG. 6, which make the last link wider (stiffer) than the rest of the links (only two are shown in dashed circles). Other possible configurations for the end-section stubs are shown in FIG. 7. These stubs can be used individually or combined.

Implementation 3—Parallel and Orthogonal Slots on Anchor

Figure 8:
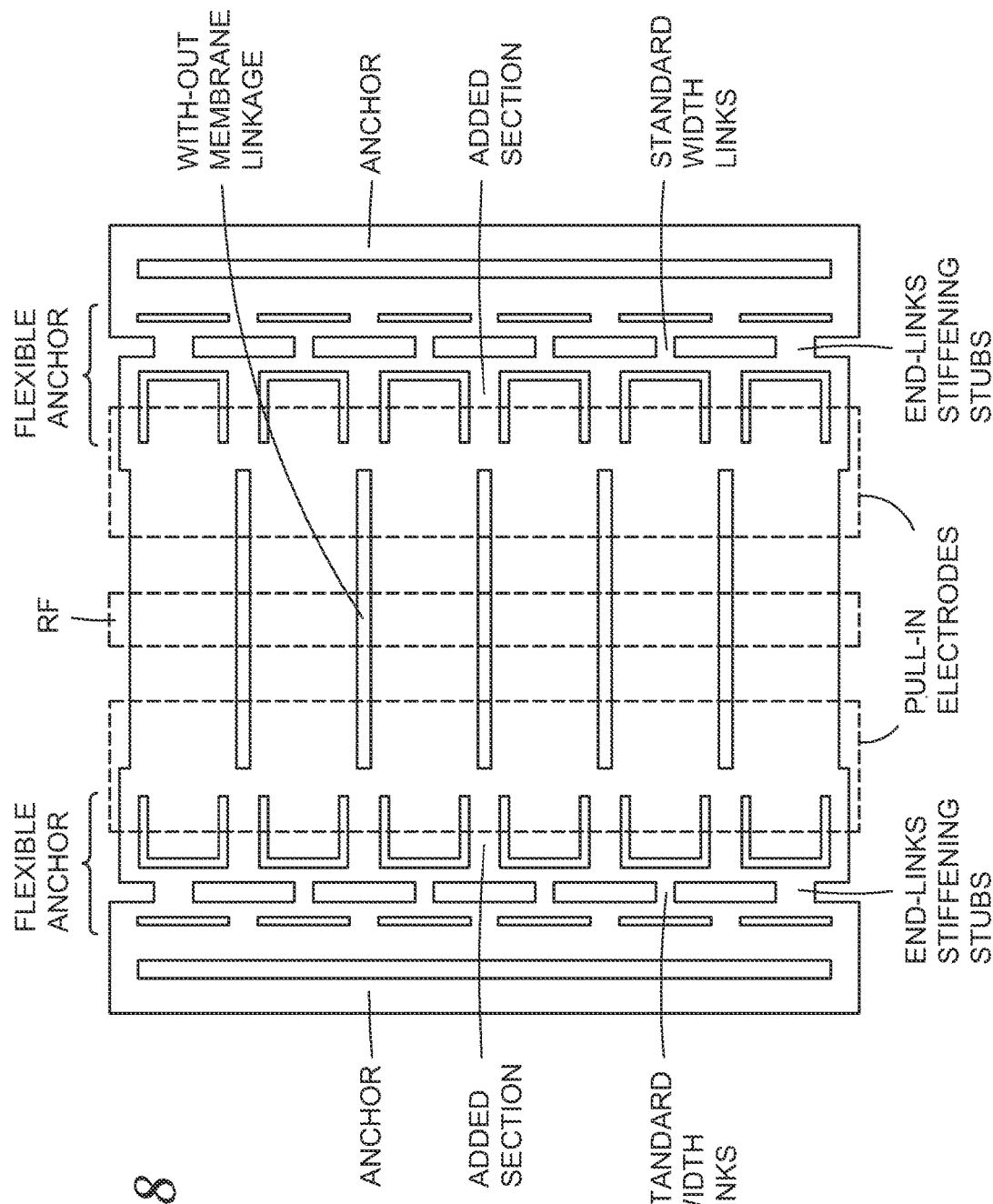
FIG. 8 shows implementation 3 of the semi-flexible anchor with orthogonal and parallel slots.
Figure 9:
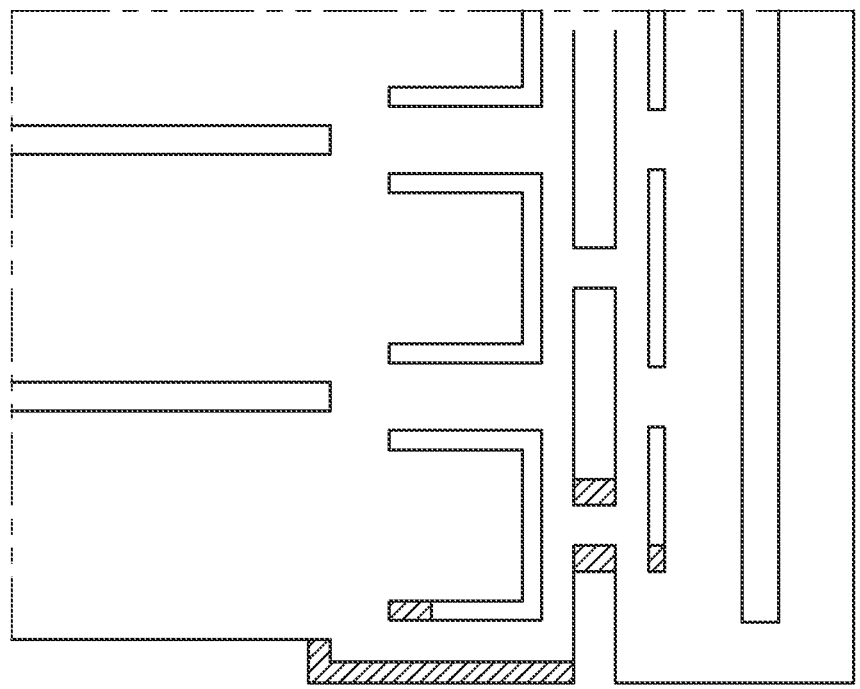
FIG. 9 shows possible locations of stiffening end-stubs for implementation 3.

A different implementation of a semi-flexible anchoring scheme with an even lower stiffness is shown in FIG. 8. This design is based on the one shown in FIG. 4, where a compliant section is added to the flexible anchor design (show in double circles). These extra links bend when the membrane is deflected, yielding on a reduced mechanical stiffness. This configuration is more sensitive to stress issues than the ones shown in Implementations 1 and 2. In the implementation shown in FIG. 8, there is not membrane linking added as such, the link between the membrane sections is due to the added "leg" which connects to the membranes of the sections on each side of the leg. The stiffening stubs on the mechanical links at the end of the membrane are also shown in FIG. 8 (dashed circles); other possible configurations for the end-section stubs are shown in FIG. 9. These stubs can be used individually or combined.

Implementation 4—Dual-Extended Parallel Slots on Anchor

Figure 10:
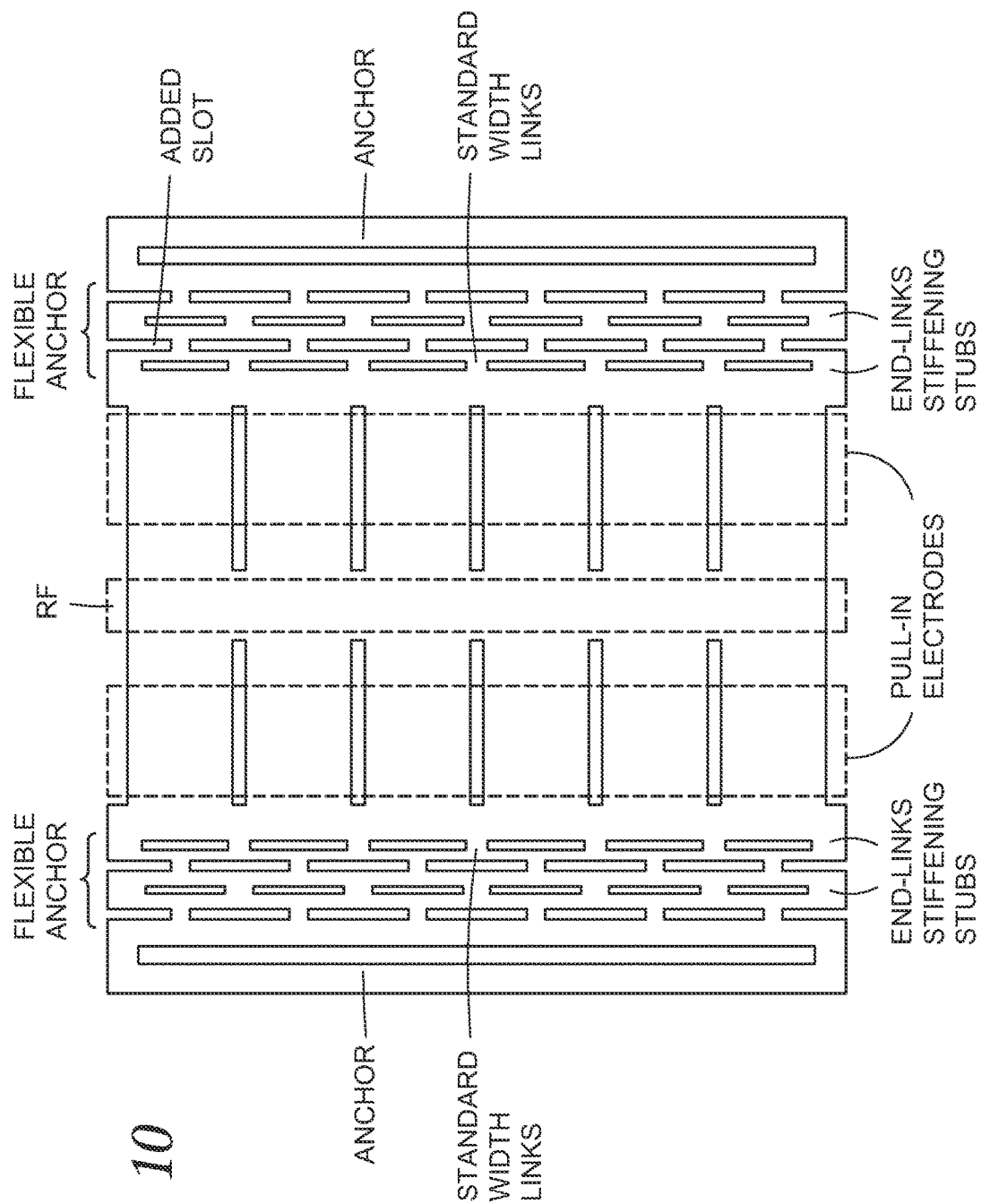
FIG. 10 shows implementation 4 of the semi-flexible anchor based on implementation 2, removing dummy metal and adding another slot.
Figure 11:
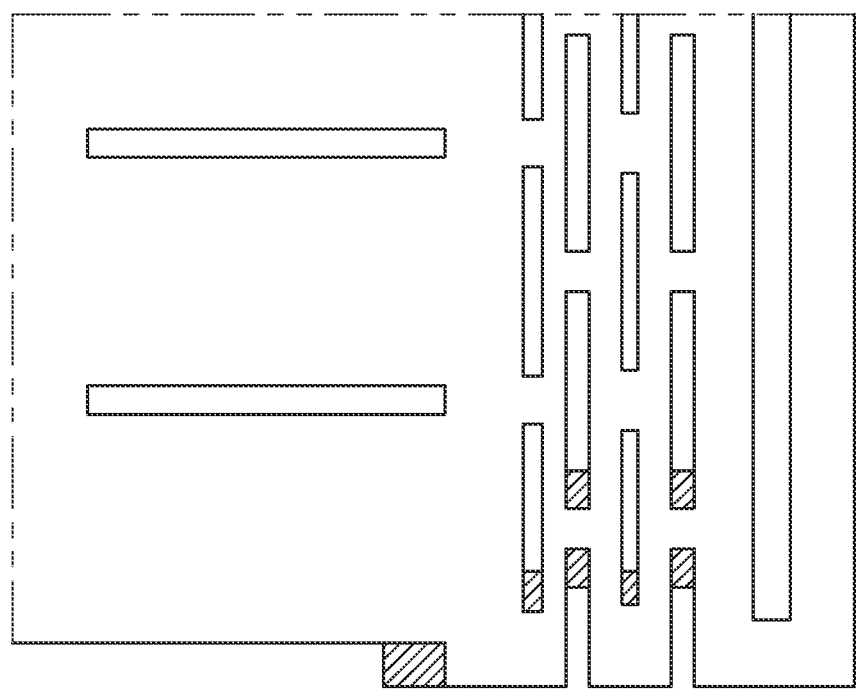
FIG. 11 shows possible locations of stiffening end-stubs for implementation 4 marked with patches.

The implementation shown in FIG. 10 is a revision of implementation 2 where the dummy metal fill is replaced by another slot. This lowers the operating voltage. FIG. 11 shows possible locations of stiffening end-stubs for implementation 4 marked with patches.

Regarding the membrane linkage, three different membrane linkages are shown in FIG. 4 (over RF), FIG. 6 (other locations than RF) and FIG. 8 (no linkage other than where the flexible anchor attaches to the membrane). There are more variations that could be designed: linked every X number of membrane sections; in a "zig-zag" fashion every X number of membrane sections; and different location every X number of membrane section.

While the foregoing is directed to embodiments of the present invention, other and further embodiments of the invention may be devised without departing from the basic scope thereof, and the scope thereof is determined by the claims that follow.

The invention claimed is:

1. A MEMS device, comprising:
a first cantilever having a first end and a second end opposite the first end, the first end and the second end defining a length of the first cantilever;
a second cantilever having a first end and a second end opposite the first end, the first end and the second end defining a length of the second cantilever; and
one or more legs coupled to both the first cantilever and the second cantilever, the one or more legs also coupled to a first anchor area that is spaced from both the first cantilever and the second cantilever,
wherein both the first cantilever and the second cantilever are disposed over a radio frequency (RF) electrode, a second electrode, and a third electrode,
wherein the first end of the first cantilever and the first end of the second cantilever are disposed over the second electrode and the second end of the first cantilever and the second end of the second cantilever are disposed over the third electrode,
wherein at least one of the one or more legs extend perpendicular to the RF electrode,
wherein the one or more legs comprise a first leg and a second leg extending between the first cantilever and the second cantilever,
wherein the first leg is parallel to and spaced from the second leg, and a third leg extending from the first leg to the first anchor area,
wherein the first leg and the second leg are parallel to the RF electrode and the third leg is perpendicular to the RF electrode, and
wherein a fourth leg extends perpendicular from the second leg to a second anchor area, the second anchor area being spaced from the first anchor area by a distance greater than the length of the first cantilever.

2. The MEMS device of claim 1, wherein the first anchor area and the second anchor area have a plurality of slots extending therethrough.

3. The MEMS device of claim 2, wherein the first anchor area and the second anchor area each comprise one or more links adjacent a corresponding slot.

4. The MEMS device of claim 3, wherein the first anchor area and the second anchor area each further comprise one or more end stiffening stubs.

5. The MEMS device of claim 4, wherein the end stiffening stubs extend parallel to the first leg and have a length that is greater than the links.

6. The MEMS device of claim 5, wherein the links have a first length extending in a direction parallel to the third leg and wherein the first anchor area and the second anchor area each further comprise one or more extended links that extend in the direction parallel to the third leg and have a second length greater than the first length.

7. The MEMS device of claim 6, wherein a slot is present between adjacent end stiffening stubs.

8. The MEMS device of claim 7, wherein the first leg is disposed over the RF electrode.

9. The MEMS device of claim 7, wherein the first leg is disposed above the second electrode.

* * * * *